(12) United States Patent
Ukigaya et al.

(10) Patent No.: US 9,508,654 B2
(45) Date of Patent: Nov. 29, 2016

(54) METHOD OF MANUFACTURING SEMICONDUCTOR DEVICE AND STRUCTURE INCLUDING PASSIVATION FILM WITH A TRENCH HAVING SECTIONS OF DIFFERENT DEPTHS AND WIDTHS

(71) Applicant: CANON KABUSHIKI KAISHA, Tokyo (JP)

(72) Inventors: Nobutaka Ukigaya, Yokohama (JP); Masao Ishioka, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/732,997

(22) Filed: Jun. 8, 2015

(65) Prior Publication Data

US 2015/0364514 A1 Dec. 17, 2015

(30) Foreign Application Priority Data

Jun. 17, 2014 (JP) ................. 2014-124683

(51) Int. Cl.
| | |
|---|---|
| *H01L 21/44* | (2006.01) |
| *H01L 21/48* | (2006.01) |
| *H01L 21/50* | (2006.01) |
| *H01L 21/00* | (2006.01) |
| *H01L 23/544* | (2006.01) |
| *H01L 31/18* | (2006.01) |
| *H01L 27/146* | (2006.01) |

(52) U.S. Cl.
CPC ....... *H01L 23/544* (2013.01); *H01L 27/14698* (2013.01); *H01L 31/1868* (2013.01); *H01L 27/14621* (2013.01); *H01L 27/14627* (2013.01); *H01L 2223/5446* (2013.01); *H01L 2223/54426* (2013.01); *H01L 2924/0002* (2013.01)

(58) Field of Classification Search
CPC ............... H01L 27/14632; H01L 27/1462; H01L 27/14687; H01L 27/14698; H01L 31/1868; H01L 23/544; H01L 2223/5446; H01L 2223/54426
USPC .................... 438/33, 68, 110, 113
See application file for complete search history.

(56) References Cited

U.S. PATENT DOCUMENTS

| | | | |
|---|---|---|---|
| 2011/0057297 A1* | 3/2011 | Lee ........... | H01L 23/562 257/620 |
| 2014/0168320 A1* | 6/2014 | Horiguchi ..... | B41J 2/14209 347/54 |
| 2014/0367777 A1* | 12/2014 | Huang ............ | H01L 21/76251 257/337 |

FOREIGN PATENT DOCUMENTS

| | | |
|---|---|---|
| JP | 58-197743 A | 11/1983 |
| JP | 61-125040 A | 6/1986 |
| JP | 3-129855 A | 6/1991 |

OTHER PUBLICATIONS

Ishioka et al., U.S. Appl. No. 14/734,155, filed Jun. 9, 2015.

*Primary Examiner* — A. Sefer
*Assistant Examiner* — Dilinh Nguyen
(74) *Attorney, Agent, or Firm* — Fitzpatrick, Cella, Harper & Scinto

(57) ABSTRACT

A method of manufacturing a semiconductor device is provided. The method includes forming a passivation film on a substrate including a plurality of element regions and a scribe region, forming a trench in the passivation film in a region of the scribe region along an outer edge of each of the element regions, and forming a film on the passivation film in which the trench has been formed by coating. A depth of a first section in a first position of the trench is shallower than a depth of a second section in a second position of the trench. A width of the first section is wider than a width of the second section.

13 Claims, 5 Drawing Sheets

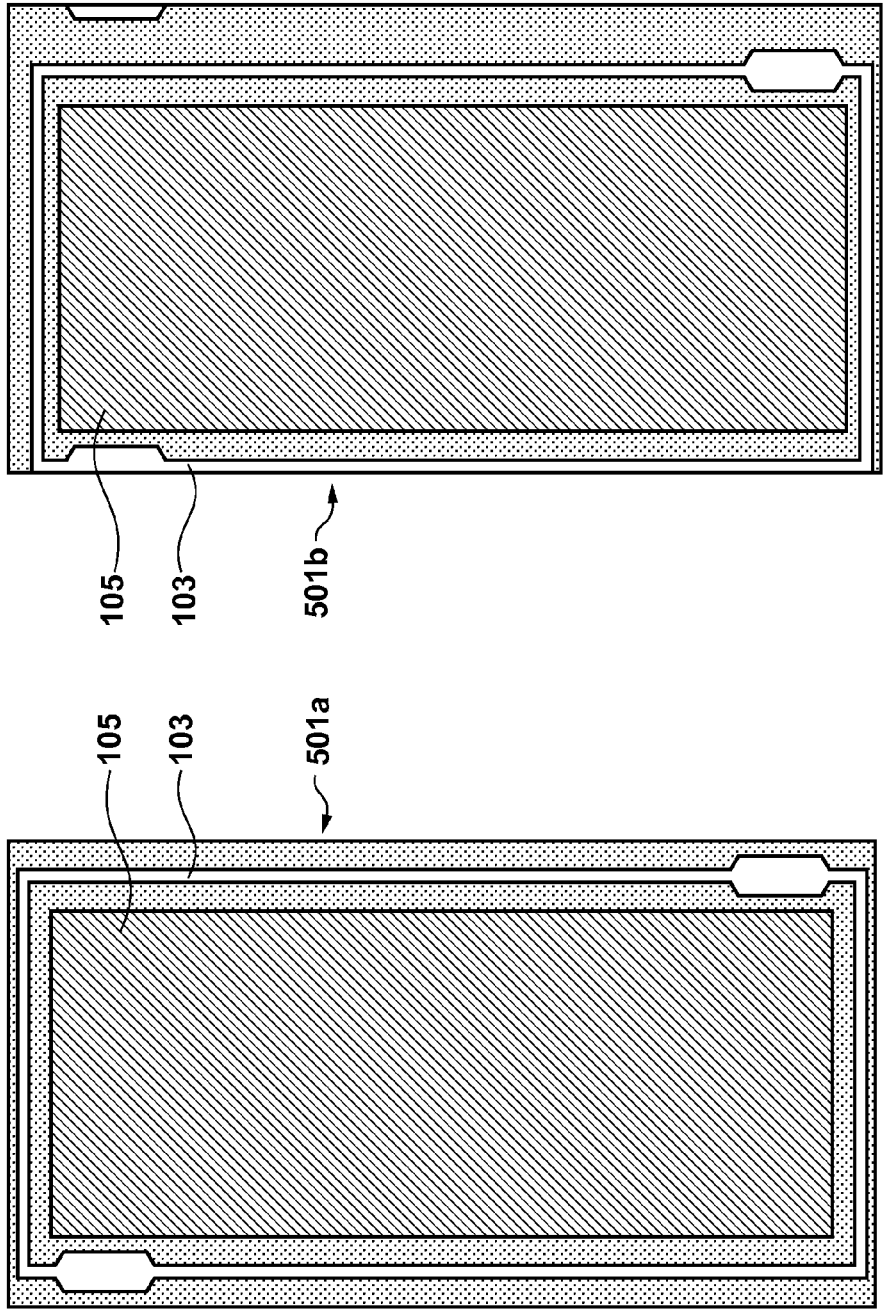

METHOD OF MANUFACTURING SEMICONDUCTOR DEVICE AND STRUCTURE INCLUDING PASSIVATION FILM WITH A TRENCH HAVING SECTIONS OF DIFFERENT DEPTHS AND WIDTHS

BACKGROUND OF THE INVENTION

Field of the Invention

The present invention relates to a method of manufacturing a semiconductor device and a structure.

Description of the Related Art

In a method of manufacturing a semiconductor device proposed in Japanese Patent Laid-Open No. 58-197743, a passivation film which covers an element region and a scribe region on a substrate, and has a trench in a boundary between the element region and the scribe region is formed. After that, the scribe region covered with the passivation film is diced. According to this manufacturing method, even if a crack is generated in the passivation film from the scribe region by a mechanical force caused by dicing, the crack is prevented by the trench from expanding to the element region. This reduces this occurrence of the crack, suppresses yield reduction caused by occurrence of the crack, and increases a yield and a workability.

SUMMARY OF THE INVENTION

The present inventors have found that the shape of a trench in a passivation film disclosed in Japanese Patent Laid-Open No. 58-197743 may cause a striation in a step of forming a film on the passivation film by coating. Some embodiments of the present invention provide a technique of suppressing occurrence of the striation in the step of forming the film by coating.

According to some embodiments, a method of manufacturing a semiconductor device, the method comprising: forming a passivation film on a substrate including a plurality of element regions and a scribe region; forming a trench in the passivation film in a region of the scribe region along an outer edge of each of the element regions; and forming a film on the passivation film in which the trench has been formed by coating, wherein a depth of a first section in a first position of the trench is shallower than a depth of a second section in a second position of the trench, and a width of the first section is wider than a width of the second section, is provided.

According to some other embodiments, a structure comprising a substrate including a plurality of element regions and a scribe region, and a passivation film on the substrate, wherein the passivation film has a trench in a region of the scribe region along an outer edge of each of the element regions, and a depth of a first section in a first position of the trench is shallower than a depth of a second section in a second position of the trench, and a width of the first section is wider than a width of the second section, is provided.

Further features of the present invention will become apparent from the following description of exemplary embodiments (with reference to the attached drawings).

BRIEF DESCRIPTION OF THE DRAWINGS

FIG. 5A is a plan view showing a completed solid-state image sensor according to the embodiment of the present invention; and FIG. 5B is a plan view showing the completed solid-state image sensor according to the embodiment of the present invention.

DESCRIPTION OF THE EMBODIMENTS

A concrete embodiment of a semiconductor device and a method of manufacturing the same according to the present invention will be described below. In the following embodiment, a solid-state image sensor will be described as an example of the semiconductor device. However, the present invention is not limited to this embodiment. For example, the present invention can be applied to not only the solid-state image sensor but also another semiconductor device such as a storage device or an arithmetic processing device.

Figure 1:
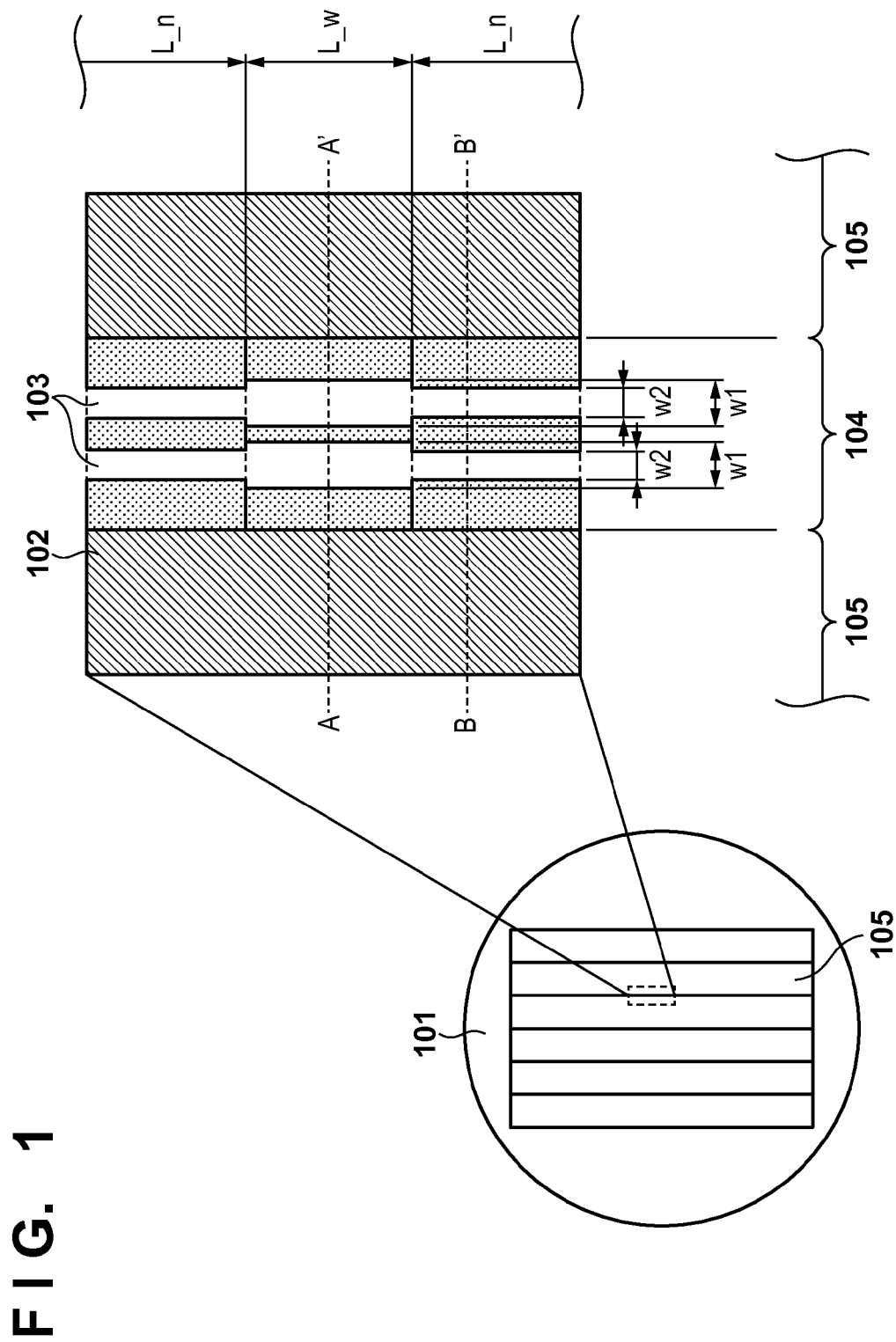
FIG. 1 is a plan view showing a structure according to an embodiment of the present invention.

The solid-state image sensor and a method of manufacturing the same according to the embodiment of the present invention will be described with reference to FIGS. 1, 2A, and 2B. FIG. 1 shows a plan view of a structure 101 used to form a plurality of solid-state image sensors and an enlarged view of the range surrounded by broken lines in the structure 101. A plurality of element regions 105 where one solid-state image sensor has been formed is arrayed in the structure 101. As will be described later, separate solid-state image sensors are obtained by dicing the structure 101. The structure 101 includes a scribe region 104 to be cut by dicing along the outer edge of each element region 105 and outside the element regions 105. The scribe region 104 may be arranged between the two adjacent element regions 105 or between the element regions 105 and the edge of the structure 101. Furthermore, in this embodiment, the plurality of element regions 105 on the structure 101 is formed in only one axial direction. However, the layout of the element regions 105 is not limited to this. For example, the plurality of element regions 105 may be formed in two axial directions respectively and arrayed in a matrix shape.

Figure 2A:
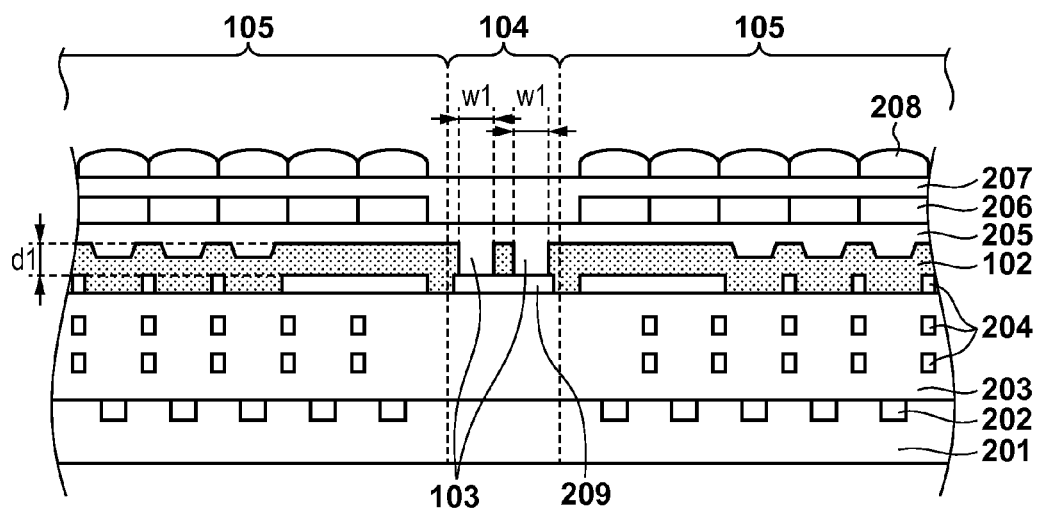
FIG. 2A is a sectional view showing the structure taken along a line A-A' in FIG. 1.

FIG. 2A is a sectional view showing the structure 101 taken along a broken line A-A' in the enlarged view of FIG. 1. FIG. 2B is a sectional view showing the structure 101 taken along a broken line B-B' in the enlarged view of FIG. 1. Semiconductor elements which constitute one solid-state image sensor, such as a photoelectric conversion element 202 which converts incident light into an electrical signal and a transistor (not shown) are formed in each element region 105 of a substrate 201.

Figure 2B:
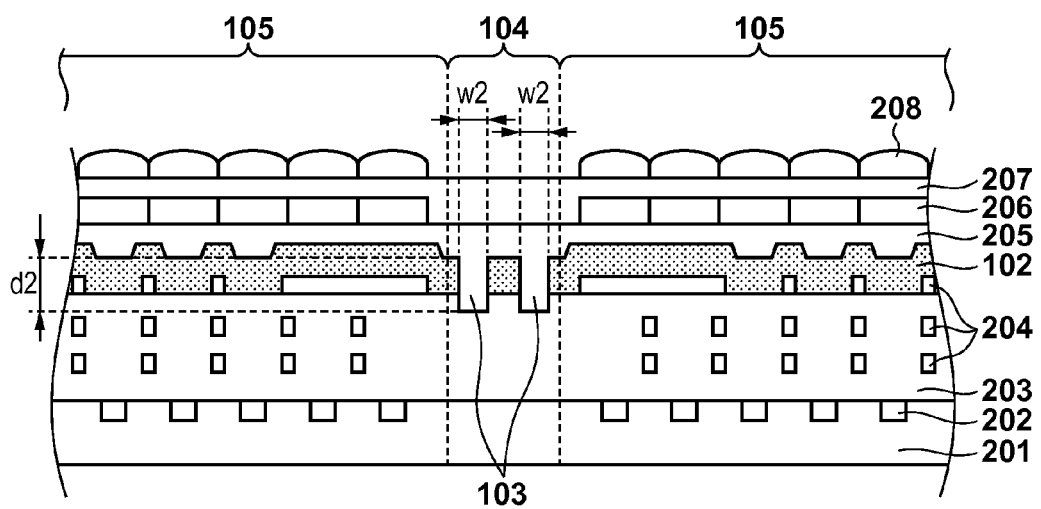
FIG. 2B is a sectional view showing the structure taken along a line B-B' in FIG. 1.

As shown in FIGS. 2A and 2B, a wiring interlayer film 203 is formed across the plurality of element regions 105 on the substrate 201. In each element region 105, a plurality of wiring layers 204 is arranged inside the wiring interlayer film 203. In a region including the scribe region 104 between the adjacent element regions 105, a pattern 209 is arranged in the same layer as the uppermost wiring layer 204. The pattern 209 is an accessory pattern used as, for example, an alignment mark or a length measurement mark necessary for a manufacturing process, and is formed simultaneously with the uppermost wiring layer 204. The pattern 209 may be formed by the same material as the wiring layers 204.

The uppermost wiring layer 204, the pattern 209, and the surface of the wiring interlayer film 203 are covered with a passivation film 102 formed from a material such as silicon oxide, silicon nitride, or silicon oxynitride. The thickness of the passivation film 102 is, for example, about 0.5 to 1 µm. On the passivation film 102, a film having translucency and a flat upper surface is provided as a planarizing film 205 to be the underlying film of a color filter. The thickness of the planarizing film 205 is, for example, about 0.5 µm. For example, an acrylic resin material such as AH859 available from JSR Corporation can be used as this planarizing film 205. On the planarizing film 205, a color filter 206 having an arbitrary color arrangement is formed, and a planarizing film 207 which planarizes the upper portion of the color filter 206 and microlenses 208 are provided.

Trenches 103 are provided in the scribe region 104 in the passivation film 102 formed on the substrate 201. The trenches 103 are formed on the pattern 209 in a first position shown in FIG. 2A taken along the broken line A-A' of the enlarged view of FIG. 1. The passivation film 102 and the pattern 209 are made of different materials. Therefore, the etching rates of the passivation film 102 and the pattern 209 are different. In this embodiment, the etching rate of this pattern 209 is lower than that of the passivation film 102, and thus the depth of each trench 103 in the first position shown in FIG. 2A is shallower than that in a second position shown in FIG. 2B taken along the broken line B-B' in the enlarged view of FIG. 1.

The problem to be solved by some embodiments of the present invention will now be described briefly. The existence of an underlying pattern makes the depth of each trench 103 according to this embodiment different in the first position and the second position. If the width of the trench 103 in the first position shown in FIG. 2A were equal to that in the second position shown in FIG. 2B, the sectional area of each trench 103 would change between the first position and the second position. In this arrangement, when a film is formed on the passivation film by spin coating, a coating material flowing through each trench by a centrifugal force overflows from a portion having a reduced sectional area. This overflowed coating material may cause a striation. If the striation occurs, variations occur in the characteristics of the formed semiconductor device, decreasing a yield. In a case in which, for example, the semiconductor device is the solid-state image sensor, if a striation occurs when forming a planarizing film, a color filter, or the like on a passivation film by coating, variations occur in the thicknesses of these films. These thickness variations cause variations in an incident light amount to the photoelectric conversion element formed under the planarizing films or the like. To prevent this, in this embodiment, each trench 103 is formed such that the width of the trench 103 in the first position shown in FIG. 2A becomes wider than that in the second position shown in FIG. 2B.

For example, a width w1 of each trench 103 shown in FIG. 2A is about 14 µm and a depth d1 of each trench 103 is about 0.5 µm. Also, for example, a width w2 of each trench 103 shown in FIG. 2B is about 10 µm and a depth d2 is about 0.7 µm which is larger than the thickness of the passivation film 102. That is, the bottom surface of each trench 103 is in the wiring interlayer film 203 under the passivation film 102.

As described above, the width of each trench 103 is set such that the trench at the broken line A-A' and the trench at the broken line B-B' have almost the same sectional area. When they have almost the same sectional area, a conductance that each coated material flowing into the trench 103 when forming the planarizing film 205 receives from the trench 103 becomes almost the same. This makes it possible to inhibit each coated material from overflowing from the trench 103 even if the depth or the width of the trench 103 has changed. Furthermore, in this embodiment, since a portion L_w and portions L_n are directly connected to each other, the sectional area of each trench 103 is almost constant in a portion between the position shown in FIG. 2A and the position shown in FIG. 2B.

Figure 3A:
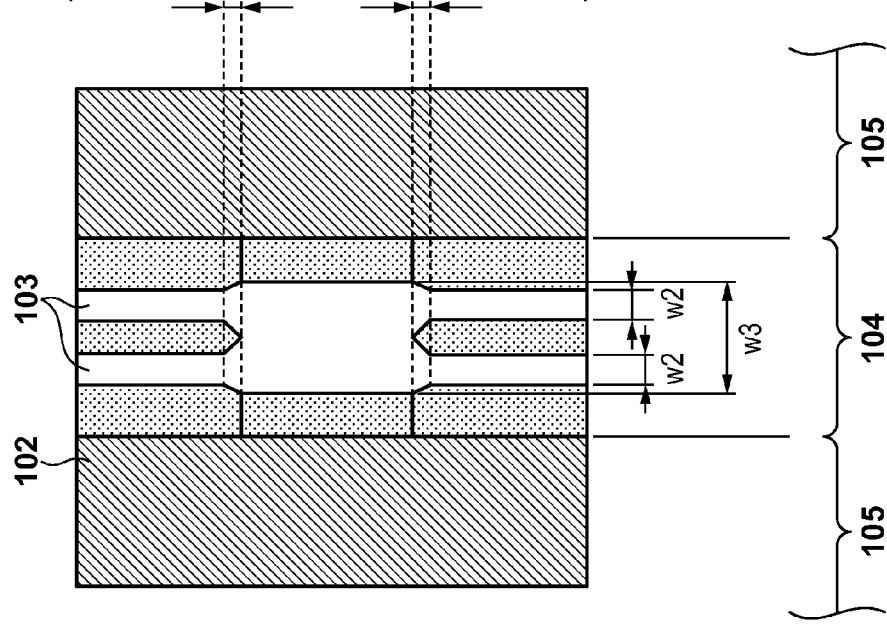
FIG. 3A is a plan view showing the structure according to the embodiment of the present invention.

In this embodiment, a case in which trenches 103 provided between the scribe region 104 and the element region 105 include two trenches 103 provided between the adjacent element regions 105 is described. However, the number of trenches 103 and their planar shapes are not limited to these. The trench 103 may have any number and any shape as long as it can prevent the crack of the passivation film 102 generated in a dicing step having the scribe region 104 as a start point from extending to each element region 105. The number of trenches can be set in consideration of the spacing between the scribe region 104 and the element regions 105 and the thickness of the passivation film 102, and further the characteristics such as the wettability and the viscosity of the material coated onto the passivation film 102, a coating condition, and the like. In a modification shown in FIG. 3A, the portion L_w and the portions L_n are not directly connected to each other but connected via buffer portions g. In the buffer portions g, the depth and the width of each trench 103 change continuously. That is, each buffer portion g does not include a portion perpendicular to the longitudinal direction of the trenches 103. The change in the depth of each buffer portion g may be achieved by, for example, performing isotropic etching so as to tilt an edge portion when forming the pattern 209. In addition, the change in the width of each buffer portion g may be achieved by changing, for example, the shape of a mask pattern which forms each trench 103. As a result, the depth and the width of each trench 103 change continuously between the portion L_w and the portions L_n. By providing the buffer portions g in the trenches 103 as described above, it is possible to suppress a rapid change in the flow of the material to be coated and further suppress occurrence of the striation. The sectional area of each trench 103 may almost be constant in the buffer portions g.

Each trench 103 may be formed between the portion L_w and the portions L_n such that its depth and width change smoothly in a sine-curve shape. Each trench 103 may also be formed such that its depth and width change linearly. The surface of each buffer portion g may have, for example, a streamline shape.

Figure 3B:
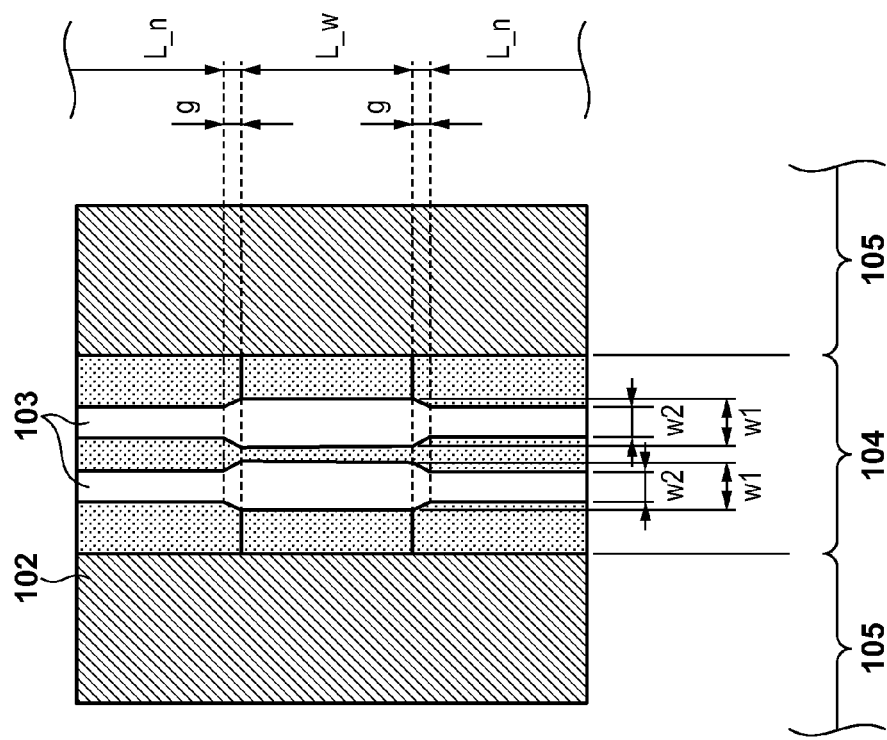
FIG. 3B is a plan view showing the structure according to the embodiment of the present invention.

Additionally, as shown in FIG. 3B, the parallel trenches 103 may be joined to each other so as to make the width of the joined trench 103 wider in the portion L_w where the depth of each trench 103 is shallow. In this case, the joined trench 103 has a width w3 and a depth d3, and is set such that its sectional area becomes equal to the sum of the sectional areas of the two trenches 103 before being joined to each other.

In this embodiment, a case in which, as shown in FIG. 2B, the trenches 103 penetrate the passivation film 102 in the depth direction has been described. However, the depth and the sectional shape of each trench are not limited to these. Each trench may have any depth and any shape as long as it can at least prevent the crack of the passivation film 102 generated in the dicing step having the scribe region 104 as the start point from extending to each element region 105.

Each trench 103 may have a depth, for example, midway along the passivation film 102. The width and the depth of each trench 103 are not limited to those described above but are set appropriately in accordance with the layout of the element regions 105 and the scribe region 104 on the substrate 201, the thickness of the passivation film 102, or the like. In this embodiment, a case in which each trench 103 has a rectangular sectional shape has been described. However, the sectional shape of each trench 103 is not limited to this. The sectional shape of each trench 103 is set appropriately in consideration of the shapes of the wiring interlayer film 203 and the uppermost wiring layer 204 serving as the underlayer of the passivation film 102, and a method of etching to form the trenches 103. The sectional shape of each trench 103 may be, for example, a polygon or a shape in which the bottom surface of the trench has a curvature. If the section of each trench 103 is not a rectangle, the width of the section of each trench 103 may be measured in the thickest portion. Alternatively, the width of the section of each trench 103 may be measured in a position having a predetermined depth from the surface of the passivation film 102. Similarly, the depth of the section of each trench 103 may be measured in the deepest portion. Alternatively, the depth of the section of each trench 103 may be measured in a predetermined position (for example, the center) of the trench 103.

A method of manufacturing the solid-state image sensor according to the above-described embodiment will now be described. The photoelectric conversion element 202, the plurality of wiring layers 204, and the wiring interlayer film 203 are formed on the substrate 201. A wiring structure formed by combining a barrier metal made of titanium, a titanium alloy, or the like and an aluminum alloy, copper, or the like can be used as the wiring layers 204. The pattern 209 is formed simultaneously with the uppermost wiring layer 204. These arrangements can be formed using an existing method, and thus a detailed description thereof will be omitted. The substrate 201 can be a semiconductor substrate such as silicon. In place of the semiconductor substrate, for example, an insulating substrate formed by a material such as glass or a plastic, or a metal substrate may also be used. In this case, the semiconductor element is formed on this substrate by silicon, germanium, gallium arsenide, or the like. Next, the passivation film 102 formed from a material such as silicon oxide, silicon nitride, or silicon oxynitride is deposited using a plasma CVD apparatus or the like so as to cover the substrate 201 on which the uppermost wiring layer 204 has been formed.

Then, a mask pattern is formed on the passivation film 102 and the passivation film 102 is patterned by etching. A region where the passivation film 102 is removed by etching includes a region of the opening portion of a pad electrode to which a lead wire is connected at the time of mounting and regions of the trenches 103 provided in the scribe region 104. By opening these at once, it is possible to achieve a reduction in the number of masks and greater efficiency of a manufacturing process. In this embodiment, a case in which the pad electrode is formed in the same layer as the wiring of the uppermost layer has been described. However, a wiring layer serving as the pad electrode is not limited to this.

Then, the planarizing film 205 is coated onto the passivation film 102 by spin coating in order to alleviate unevenness of the passivation film 102 caused by the uppermost wiring layer 204 and the pattern 209. This planarizing film 205 is made of, for example, AH859 available from JSR Corporation, and is formed at 900 rpm and for about 20 sec. After coating, baking is performed for 180 sec at 100° C. and another 360 sec at 230° C. As a result, the planarizing film 205 of about 0.5 μm is formed. A coating method to form the planarizing film 205 is not limited to spin coating. It may be, for example, slit coating or inkjet. The planarizing film 205 is not limited to an acrylic resin material but may be a fluid material when coated. This planarizing film 205 improves the shape stability of the color filter 206 formed on the planarizing film 205 and also improves the spectral stability of a solid-state image sensor determined by the color filter 206. Then, the RGB color filter 206 is formed for respective colors and the planarizing film 207 is further formed on the color filter 206. Furthermore, the microlenses 208 are formed on the planarizing film 207. The structure 101 shown in FIG. 1 is manufactured, as described above. After that, this structure 101 is diced in the scribe region 104 and divided into the separate solid-state image sensors.

Figure 4:
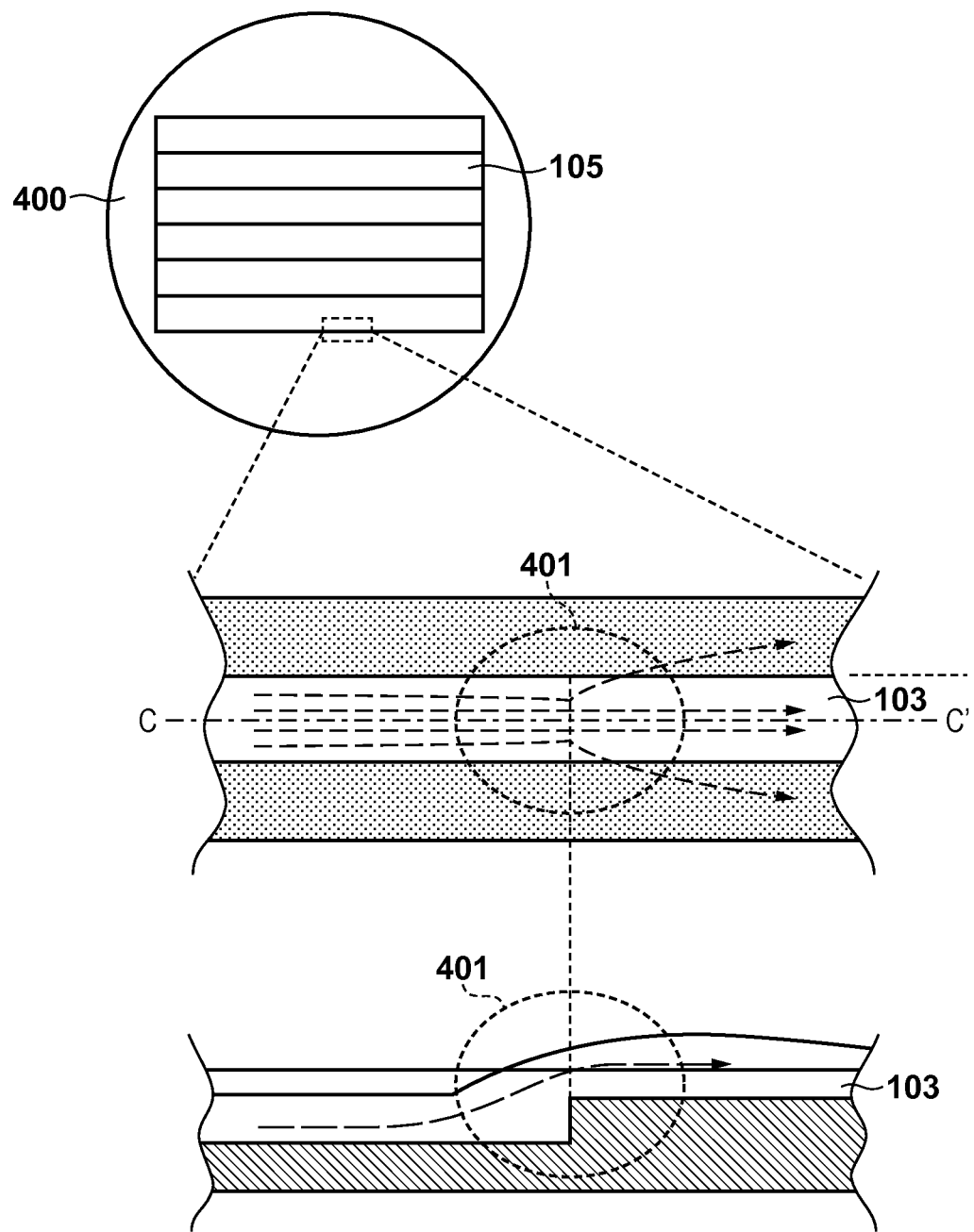
FIG. 4 shows a plan view and a sectional view showing the structure according to a comparative example.

The effect of this embodiment will be described with reference to a comparative example in FIG. 4. In a trench-shape structure 400 shown in FIG. 4, a striation is likely to occur from a place as a start point where the sectional area of each trench changes in the longitudinal direction of the trench. Note that the place where the sectional area changes is, for example, a place where the depth of each trench having a constant width becomes shallow locally or a place where the width of a trench having a constant depth becomes narrow locally. Particularly, the striation is likely to occur in a place 401 where the sectional area changes discontinuously as shown in FIG. 4. A material is coated, by spin coating, onto the substrate 201 where the trenches 103 having a structure shown in FIG. 4 are formed. In this case, in the place 401 where the width of each trench 103 is constant and its depth becomes shallow, the sectional area of each trench changes in the longitudinal direction of the trench and the traveling direction of a material flowing inside the trench changes. A part of the material overflows from the place where a local change in the flow has occurred as described above and a striation occurs from the place as a start point. The case in which the width of each trench is constant and its depth changes to be shallower has been described. Similarly, a part of a material overflows and a striation occurs from that as a start point in a case in which the depth of each trench is constant and its width changes narrowly. If a locally generated striation reaches the element region, the variations occur in the incident light amount to the photoelectric conversion element 202 formed on the substrate 201 below the planarizing film 205, as compared with an element region without any striation. As a result, the variations occur in the characteristics of the formed semiconductor device, decreasing the yield.

On the other hand, according to the above-described embodiment, the width of each trench 103 provided in the scribe region 104 of the passivation film 102 is set with respect to the depth of each trench such that the trenches have almost the same sectional area in a portion where a step by the underlying film is formed in the longitudinal direction of the trenches 103. This makes it possible to, when coating the planarizing film 205, suppress the local overflow of the coated material since the flow of the coated material is not blocked. This makes it possible to suppress the striation of the planarizing film 205 coated onto the passivation film 102 and reduce degradation in an optical characteristic caused by the striation. As a result, the characteristic degradation of the solid-state image sensor is improved and the problem of yield reduction caused by the characteristic degradation is also improved. Consequently, both of product performance and a manufacturing yield can be improved.

FIGS. 5A and 5B are plan views each showing the completed solid-state image sensor. A solid-state image sensor 501a in FIG. 5A is obtained if dicing is performed in the center of the scribe region 104. A solid-state image sensor 501b in FIG. 5B is obtained if dicing is performed shifted in the upper right direction of FIG. 5B from the center of the scribe region. In either case, the trench 103 is formed such that its depth is shallow in a portion where its width is wide and its depth is deep in a portion where its width is narrow, unlike the structure in the comparative example of FIG. 4.

Note that a halftone photomask can also be used when forming the mask pattern for forming the trench. Using such a photomask to form the mask pattern facilitates continuous changes in the depth and the width of the trench. The halftone photomask includes, for example, an area coverage modulation mask and a gray-tone mask.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-124683, filed Jun. 17, 2014, which is hereby incorporated by reference wherein in its entirety.

What is claimed is:

1. A method of manufacturing a semiconductor device, the method comprising:
    forming a passivation film on a substrate including a plurality of element regions and a scribe region;
    forming a trench in the passivation film in a region of the scribe region along an outer edge of each of the element regions; and
    forming a film on the passivation film in which the trench has been formed by coating,
    wherein a depth of a first section in a first position of the trench is shallower than a depth of a second section in a second position of the trench, and a width of the first section is wider than a width of the second section.

2. The method according to claim 1, wherein at least one of the depth or the width of the trench changes continuously in a portion between the first position and the second position.

3. The method according to claim 1, wherein at least one of the depth or the width of the trench changes with a sinusoidal curve in a portion between the first position and the second position.

4. The method according to claim 1, wherein at least one of the depth or the width of the trench changes linearly in a portion between the first position and the second position.

5. The method according to claim 1, wherein a sectional area of the first section and a sectional area of the second section are equal to each other.

6. The method according to claim 5, wherein a sectional area of the trench is constant in the portion between the first position and the second position.

7. The method according to claim 1, wherein the first position and the second position of the trench are different from each other in a portion of the trench extending to one direction.

8. The method according to claim 1, further comprising forming a pattern above an underlayer of the passivation film, wherein in forming the passivation film, the passivation film is formed above the underlayer having the pattern, and the first position of the trench is over the pattern.

9. The method according to claim 8, wherein in forming the trench, the trench is formed by etching the passivation film, and the depth of the first position of the trench is shallower than the depth of the second position.

10. The method according to claim 8, wherein the pattern includes at least one of an alignment mark or a length measurement mark.

11. The method according to claim 1, wherein a plurality of the trenches is formed in the scribe region between the adjacent element regions in the passivation film, and the plurality of trenches includes a first trench and a second trench parallel to each other, and a portion in the first position of the first trench and a portion in the first position of the second trench are joined to each other.

12. The method according to claim 1, further comprising cutting the substrate in the scribe region after forming the film.

13. The method according to claim 1, wherein the semiconductor device is a solid-state image sensor.

* * * * *